United States Patent
Okami

(10) Patent No.: US 6,818,837 B2
(45) Date of Patent: Nov. 16, 2004

(54) WIRING CONNECTION STRUCTURE AND TRANSMITTER USING THE SAME

(75) Inventor: Mitsutoshi Okami, Kashiba (JP)

(73) Assignee: Sharp Kabushiki Kaisha, Osaka (JP)

( * ) Notice: Subject to any disclaimer, the term of this patent is extended or adjusted under 35 U.S.C. 154(b) by 0 days.

(21) Appl. No.: 10/263,185

(22) Filed: Oct. 3, 2002

(65) Prior Publication Data

US 2003/0070837 A1 Apr. 17, 2003

(30) Foreign Application Priority Data

Oct. 11, 2001 (JP) ........................................ 2001-313678

(51) Int. Cl.⁷ ................................................. H05K 1/16
(52) U.S. Cl. ........................ 174/260; 174/261; 174/262; 361/760; 361/804; 439/65
(58) Field of Search ................................. 260/260, 250, 260/261, 262, 266; 361/760, 803, 804; 439/65, 74

(56) References Cited

U.S. PATENT DOCUMENTS

| | | | | |
|---|---|---|---|---|
| 3,812,381 A | * | 5/1974 | Guyton | 361/803 |
| 5,159,537 A | * | 10/1992 | Okano | 361/816 |
| 5,253,146 A | * | 10/1993 | Halttunen et al. | 361/784 |
| 6,465,746 B1 | * | 10/2002 | Kajita | 174/260 |
| 2002/0153976 A1 | * | 10/2002 | Pluymers | 333/246 |

FOREIGN PATENT DOCUMENTS

| | | | |
|---|---|---|---|
| JP | 4-188690 | | 7/1992 |
| JP | 409180788 A | * | 7/1997 |

* cited by examiner

*Primary Examiner*—Evan Pert
*Assistant Examiner*—J B Patel
(74) *Attorney, Agent, or Firm*—Birch, Stewart, Kolasch Kolasch & Birch, LLP

(57) ABSTRACT

A transmitter includes an RF board having a circuit for processing high frequency signals, an IF board having a circuit for processing intermediate frequency signals, a shield plate formed of a conductive material arranged between the boards for shielding electromagnetic waves generated from the circuits, a board-to-board connecting wire inserted to a through hole based by a gap sufficient to avoid electric influence from an inner wall surface of the through hole provided in the shield plate, to be connected to through hole lands provided on the RF board and a IF board, respectively, and connectors formed of an insulating material and attached near opposite ends of the board-to-board connecting wire and sandwiching the shield plate, for fixing the board-to-board connecting wire to the shield plate. This provides a wiring connection structure that facilitates connection between circuit boards with each other and stably realizes normal signal transmission.

8 Claims, 4 Drawing Sheets

US 6,818,837 B2

WIRING CONNECTION STRUCTURE AND TRANSMITTER USING THE SAME

This nonprovisional application claims priority under 35 U.S.C. § 119(a) on Patent Application No. 2001-313678 filed in JAPAN on Oct. 11, 2001, which is herein incorporated by reference.

BACKGROUND OF THE INVENTION

1. Field of the Invention

The present invention relates to a wiring connection structure for establishing electrical connection between circuit boards on which circuits for processing high frequency signals and intermediate frequency signals are provided. The present invention also relates to a transmitter in which wires are connected using the wiring connection structure.

2. Description of the Background Art

Recently, as the field of wireless communication has been developed remarkably, various devices for wireless communication have been developed and used widely. In these devices used for wireless communication, electromagnetic waves generated from circuits pose a significant problem, as signals having relatively high frequency, such as high frequency signals and intermediate frequency signals are used.

A common solution to this problem is to surround a circuit board with a conductive material to form an electromagnetic shield, so as to prevent undesirable influence on other external or internal circuitry. When there are a plurality of circuit boards, it is necessary to electrically connect the circuit boards with each other. Therefore, the wiring connection structure comes to be of greater importance, considering relation with the conductive material forming the electromagnetic shield. In the following, a transmitter transmitting microwaves will be considered as a representative example of the device of this type, and the structure thereof will be described.

Wireless communication using microwaves has been developed explosively in these days, in many systems including broadcasting satellite and communication satellite. At the same time, there is an increasing demand for bi-directional communication, along with the development of the Internet and a start of digital BS (Broadcasting Satellite) service. In bi-directional communication involved in satellite communication, reception can be done using an LNB (Low Noise Block down converter) as in the prior art, while transmission requires a new transmitter.

FIG. 3 is a block diagram showing an example of a circuit mounted on the transmitter. An IF (Intermediate-Frequency) signal and a DC (Direct Current) voltage input through an IF/DC input terminal are input to an IF amplifier circuit 1 and to a power supply circuit 2, respectively. The IF signal input to IF amplifying circuit 1 is subjected to appropriate amplification, and thereafter, fed to an RF (Radio-Frequency) amplifier circuit 3. The IF signal input to RF amplifier circuit 3 is mixed with a local oscillation signal that has also been input to RF amplifier circuit 3 from a local oscillation circuit 4, and has its frequency converted to be an RF signal having higher frequency than the IF signal. The thus converted RF signal is appropriately amplified by RF amplifier circuit 3, input to power amplifier 5 to be further amplified to a high power high frequency signal, and output from the transmitter.

It is often the case that the circuits are provided separately on an IF board 15 having IF amplifier circuit 1 and power supply circuit 2 formed therein, and an RF board 14 having RF amplifier circuit 3 and local oscillation circuit 4 formed therein. The reason for this is that signals flowing through respective circuits differ in frequency, and therefore, it is necessary to select materials of circuit boards that have characteristics more desirable for respective frequencies. Specifically, in view of dielectric constant of the circuit board material, a composite circuit board or the like is used for the IF board through which IF signals having relatively low frequency flow, and a PTFE (polytetra fluoro ethylene) board or the like is used for the RF board through which RF signals of high frequency flow.

Another reason why the circuit board is divided is the reduction in size of the transmitter. When all the circuits are formed on a single circuit board, it is necessary to use a large circuit board, and hence, the transmitter naturally becomes large. When the circuit board is divided and the divided boards are arranged parallel to each other, the size of the transmitter can be reduced.

From the above described reasons, such a structure is often employed in a transmitter that the circuit board is divided into two, that is, the IF board and the RF board, which are connected by a board-to-board connecting wire such as a vinyl covered cable or a coaxial cable.

The structure of this type of transmitter will be described with reference to FIGS. 4 and 5. Various components are assembled in a chassis 10 as an outer frame of the transmitter. In the transmitter shown in the figure, chassis 10 has a box shape with rectangular parallelepiped outer shape. Shield plates 11 are provided in the horizontal direction inside the chassis, and by the shield plates 11, the space inside chassis 10 is divided into three.

In the uppermost one of the three-divided spaces, RF board 14 is accommodated. A frame 16 is assembled above RF board 14, and further thereon an RF shield lid 17 is provided to seal the uppermost space of the chassis 10. In the middle space, electric parts such as condensers are mainly accommodated. The condenser is relatively large as compared with other electric components, and it is not mounted on the circuit board but arranged in the middle space of the chassis 10. Further, in the lowermost space of chassis 10, IF board 15 is accommodated, and further therebelow, an IF shield lid 18 for sealing the lowermost space of chassis 10 is provided.

Chassis 10 and the shield plate 11 provided on chassis 10 are formed of a conductive material such as metal, so as to prevent leakage to the outside of the electromagnetic waves generated from RF amplifier circuit 3, IF amplifier circuit 1 or the like as well as to prevent entrance of the electromagnetic waves from the outside. For the same purpose, RF shield lid 17 and IF shield lid 18 are also formed of a conductive material.

The wiring connection structure will be described in detail in the following. Referring to FIG. 5, in order to electrically connect RF board 14 accommodated in the uppermost space with IF board 15 accommodated in the lowermost space, a through hole 12 connecting these spaces is provided at prescribed positions in the upper and lower shield plates 11 of chassis 10. A power supply line 6 and a signal line 7 are inserted to through hole 12. For such board-to-board connecting wire 20, a vinyl covered cable or a coaxial cable having a core line 21 covered with an insulating member 22 is used, so as to prevent contact with the chassis 10.

Further, at such positions of RF board 14 and IF board 15 that are opposite to the through hole 12 of shield plate 11, through holes 25 and 26 are formed. On the surface of the circuit board at the peripheral edge of the through holes 25, 26 and on inner wall surfaces of through holes 25 and 26, an electrode (through hole land) 27 of a conductive material is formed. The core line 21 of the aforementioned board-to-board wiring 20 is inserted to the through holes 25, 26 and core line 21 is connected to through hole land 27 by solder 28, whereby electrical connection between RF board 14 and IF board 15 is established.

The connection procedure to realize the above described wiring connection structure is as follows. First, the board-to-board connecting wire that is cut into a prescribed length and has covers at opposite ends peeled off is inserted to the through hole of the chassis of the transmitter. Thereafter, one circuit board is brought into contact with the shield plate of the chassis, and at the same time, a tip end of the core line of board-to-board connecting wire is inserted to the through hole of the circuit board. Then, the other circuit board is brought into contact with the other shield plate of the chassis, and at the same time, the other end of the board-to-board connecting wire is inserted to the though hole of the circuit board. Thereafter, the through hole land of each circuit board is connected to the core line of board-to-board connecting wire by soldering. Through the above described steps, the above described wiring connection structure is realized.

When the above described wiring connection structure is employed, it is necessary to insert the tip end of the wire to the through hole of the circuit board. It is, however, very difficult to insert tip ends of a plurality of wires, which are not fixed, simultaneously into through holes. A method may be possible in which, different from the procedure described above, the wire is fixed in advance by soldering the wire on one circuit board, and thereafter the other circuit board is positioned and assembled. Still, in this case also, it is difficult to insert tip ends of a plurality of wires simultaneously to the through hole with only one end of each wire fixed.

For easier connection, it may be possible to enlarge opening diameter of the through holes of boards, so as to ease insertion of the core line of the vinyl covered cable for power supply or the coaxial cable for signals into the through hole. When the opening diameter of the through hole is enlarged, however, the gap between core line 21 and through hole land 27 becomes larger as shown in FIG. 6, and solder 28 used for connection possibly drips off through the gap and solder 28 possibly contacts shield plate 11 of chassis 10, resulting in electrical short-circuit.

When solder 28 comes close to the shield plate 11 of chassis 10, though not as far as to contact the shield plate, impedance of the signal flowing through the board-to-board connecting wire may change. When the impedance through the board-to-board connecting wire as a signal line changes, output level of the signal also changes, possibly hindering satisfactory transmission. Further, there is also a problem that, when solder 28 contacts the cover of board-to-board connecting wire, insulating member 22 may melt, affecting reliability of the device.

SUMMARY OF THE INVENTION

An object of the present invention is to provide a wiring connection structure that enables easy connection of circuit board with each other, stably realizing normal signal transmission, and to provide a transmitter employing the wiring connection structure.

In order to attain the above described objects, the present invention provides a wiring interconnection structure including: a first circuit board having a first electronic circuit formed thereon; a second circuit board having a second electronic circuit formed thereon; a conductive member arranged between the first and second circuit boards; a board-to-board connecting wire inserted through a through hole spaced by a gap sufficient to prevent electrical influence from an inner wall surface of the through hole provided in the conductive member, for electrically connecting an electrode provided on the first circuit board to an electrode provided on the second circuit board; and connectors attached near opposite ends of the board-to-board connecting wire to sandwich conductive member, for fixing the board-to-board connecting wire on the conductive member.

In the present structure, the board-to-board connecting wire is fixed on the conductive member by using connectors, and therefore electrical connection between the board-to-board connecting wire and the electrode is facilitated. Thus, efficiency in processing significantly improves, and manufacturing cost can be reduced. Further, positional accuracy of the wire can be controlled more precisely, and therefore, number of defective connections can significantly be reduced. In the conventional wiring connection structure, a board-to-board connecting wire having the core line covered to prevent short-circuit between the board-to-board connecting wire and a conductive member has been used. When the wiring connection structure of the present invention is employed, the distance between the board-to-board connecting wire and the conductive member can stably be maintained by the connectors, and therefore, it becomes possible to use the board-to-board connecting wire in the form of a bare core line.

In the wiring connecting structure of the present invention described above, preferably, each of the first and second circuit boards, for example, has a hole to which a tip end of board-to-board connecting wire is inserted, an electrode is formed at a peripheral edge of the hole, and the board-to-board connecting wire and the electrode are connected to each other by a brazing material.

When the wiring connection structure of this arrangement is employed, the hole provided in the circuit board can be made smaller as compared to the prior art even when the connection between the electrode of the circuit board with the board-to-board connecting wire is made by solder, and therefore, dripping off of the solder can be prevented. This is because the positional accuracy between the connecting portion of board-to-board connecting wire and the corresponding hole can be controlled more precisely at the time of connection, as the board-to-board connecting wire is fixed on the conductive member by using connectors. Accordingly, the amount of solder used for soldering can be reduced as compared with the prior art. As a result, possibility of short-circuit resulting from defective connection and change in impedance can significantly be reduced.

In the wiring connection structure of the present invention described above, desirably, the conductive member is provided with a first recessed portion on a surface facing the first circuit board, for accommodating a connector attached near one end of the board-to-board connecting wire, and a second recessed portion on a surface facing the second circuit board, for accommodating a connector attached near the other end of the board-to-board connecting wire, and the connectors are fitted in and fixed in the recessed portions.

By this arrangement, it becomes possible to fix the board-to-board connecting wire more firmly on the conductive member, as the connectors attached near opposite ends of the board-to-board connecting wire are fitted in the recessed portions of the conductive member. Further, as it is possible to prevent protrusion of the connector from the surface of the conductive member on which the circuit board is attached, increase in size of the device caused by the use of connector can be prevented.

In the wiring connection structure of the present invention described above, preferably, the connector is formed of a resin material.

When the connector is molded with a resin material as in this arrangement, it becomes possible to easily manufacture the insulative connector of a desired shape. Further, use of a resin material enables manufacturing in large quantity at low cost.

The transmitter in accordance with the present invention includes: a plurality of circuit boards each provided with a circuit for processing electric signals of high frequency or intermediate frequency or both; a conductive member arranged between the plurality of circuit boards for shielding electromagnetic waves generated from the circuit; a board-to-board connecting wire inserted through a through hole spaced by a gap sufficient to prevent electrical influence from inner wall surface of the through hole provided in the conductive member, for electrically connecting electrodes provided on respective ones of the plurality of circuit boards with each other; and connectors attached near opposite ends of the board-to-board connecting wire and sandwiching the conductive member for fixing the board-to-board connecting wire on the conductive member.

In this arrangement, the wiring connection structure described above may be applied as the wiring connection structure for connecting circuit boards with each other in a transmitter. In a transmitter, signals in the high frequency range or the intermediate frequency range pass through the circuit boards, and therefore a conductive member is often arranged as an electromagnetic shield, between the circuit boards. When the wiring connection structure described above is employed here, efficiency in processing can be improved and defective connection can be reduced.

In the transmitter of the present invention, preferably, each of the plurality of circuit boards has a hole through which a tip end of the board-to-board connecting wire is inserted, an electrode is formed at a peripheral edge of the hole, and the board-to-board connecting wire and the electrode are connected to each other by a blazing material.

In this arrangement also, in which the board-to-board connecting wire and the electrode of the circuit board are connected by solder in a transmitter, the hole provided in the circuit board can be made smaller than in the prior art, and hence dripping-off of the solder can be prevented. As a result, possibility of short-circuit resulting from defective connection and change in impedance can significantly be reduced, and stable signal output is realized.

In the transmitter of the present invention described above, desirably, the conductive member is provided with recessed portions on surfaces facing the circuit board for accommodating connectors, and the connectors are fitted and fixed in these recessed portions.

By this arrangement, it becomes possible in a transmitter also, to fix the board-to-board connecting wire more firmly on the conductive member, as the connectors are fitted in the recessed portions of the conductive member. Further, provision of the recessed portions on the conductive member prevents increase in size of the transmitter that would otherwise be caused by the use of connectors.

In the transmitter of the present invention, desirably, the connector is formed of a resin material.

When the connector used for the transmitter is formed of a resin material as in this arrangement, it becomes possible to easily manufacture insulative connectors of a desired shape. Further, use of resin material enables manufacturing in large quantity at low cost.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Embodiments of the present invention will be described in the following, taking a transmitter as an example. The wiring connection structure in accordance with the present embodiment employs a board-to-board connecting wire in the form of a bare core line only, without any cover.

(Wiring Connection Structure)

Figure 1:
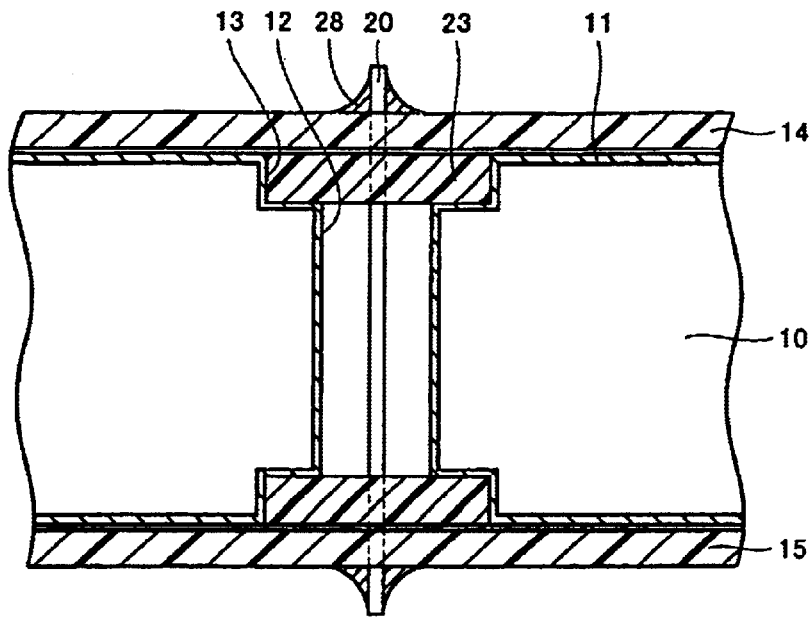
FIG. 1 is a schematic cross section representing the wiring connection structure of a transmitter in accordance with an embodiment of the present invention.

First, referring to FIG. 1, in the transmitter according to the present embodiment also, RF board 14 and IF board 15 are arranged to sandwich shield plate 11 of chassis 10 therebetween. Shield plate 11 has a through hole 12 to which board-to-board connecting wire 20 is inserted, of which diameter is relatively large, so as to prevent contact between the inner wall thereof and the board-to-board connecting wire 20. By the gap in through hole 12, insulation between shield plate 11 of chassis 10 and board-to-board connecting wire 20 is maintained.

Further, at opposite end portions of through hole 12 provided in shield plate 11 of chassis 10, that is, at the periphery of through hole 12 at the surfaces of shield plate 11 facing RF board 14 and IF board 15, recessed portions 13 are provided. Connectors 23 attached to board-to-board connecting wire 20 to be fitted in recessed portions 13 are provided between chassis 10 and each of circuit boards 14 and 15. The connector 23 is molded by a resin material, and the board-to-board connecting wire 20 is inserted to a hole provided at a central portion of the connector, whereby the connector is fixed to board-to-board connecting wire 20.

Figure 2:
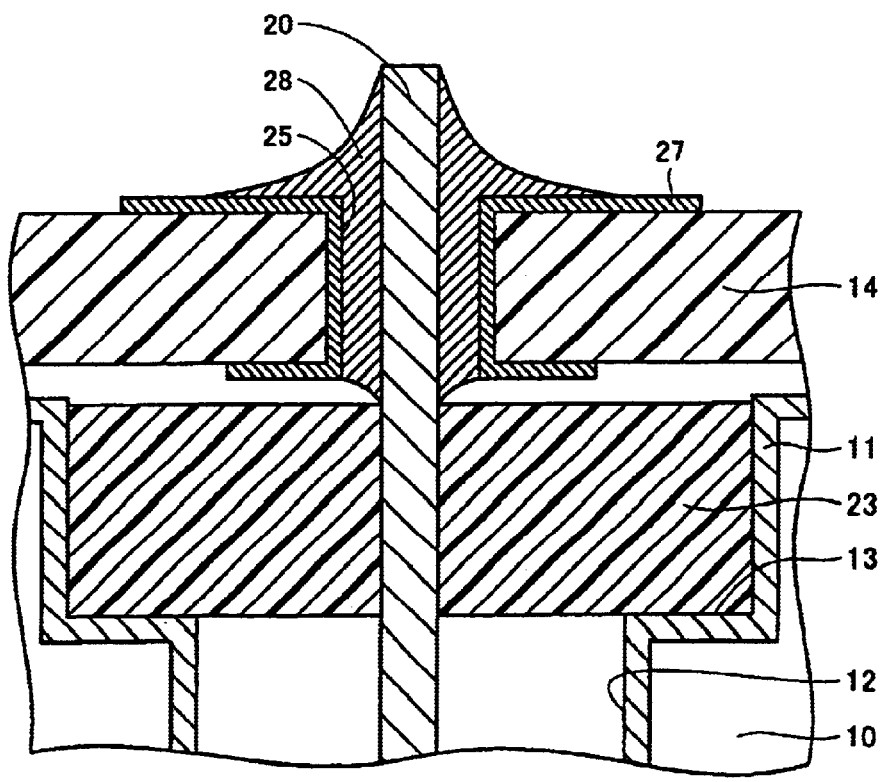
FIG. 2 is an enlarged cross section of a soldered portion, illustrating the wiring connection structure of the transmitter in accordance with an embodiment of the present invention.
Figure 3:
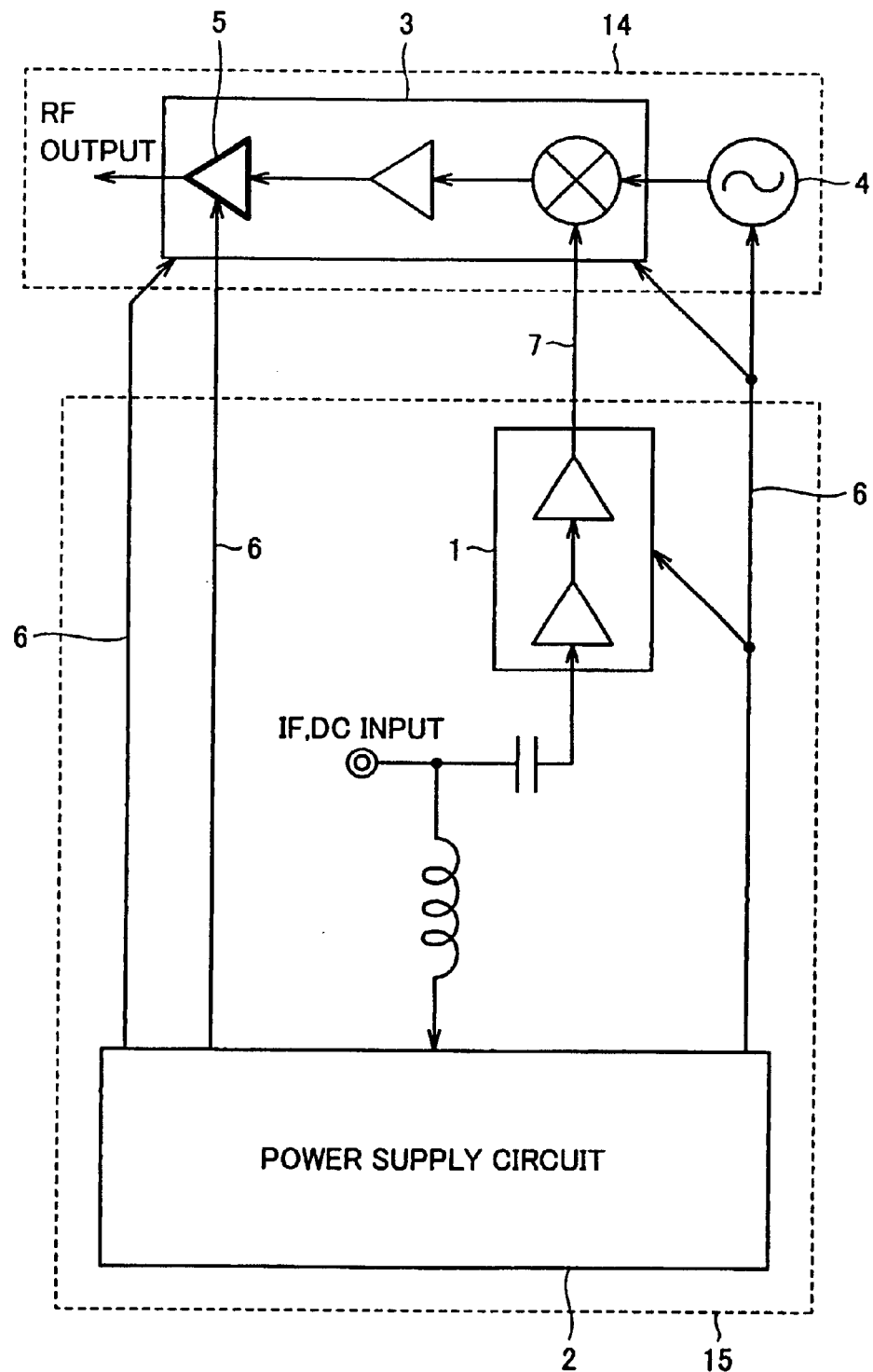
FIG. 3 is a block diagram representing an example of a circuit mounted on the transmitter.
Figure 4:
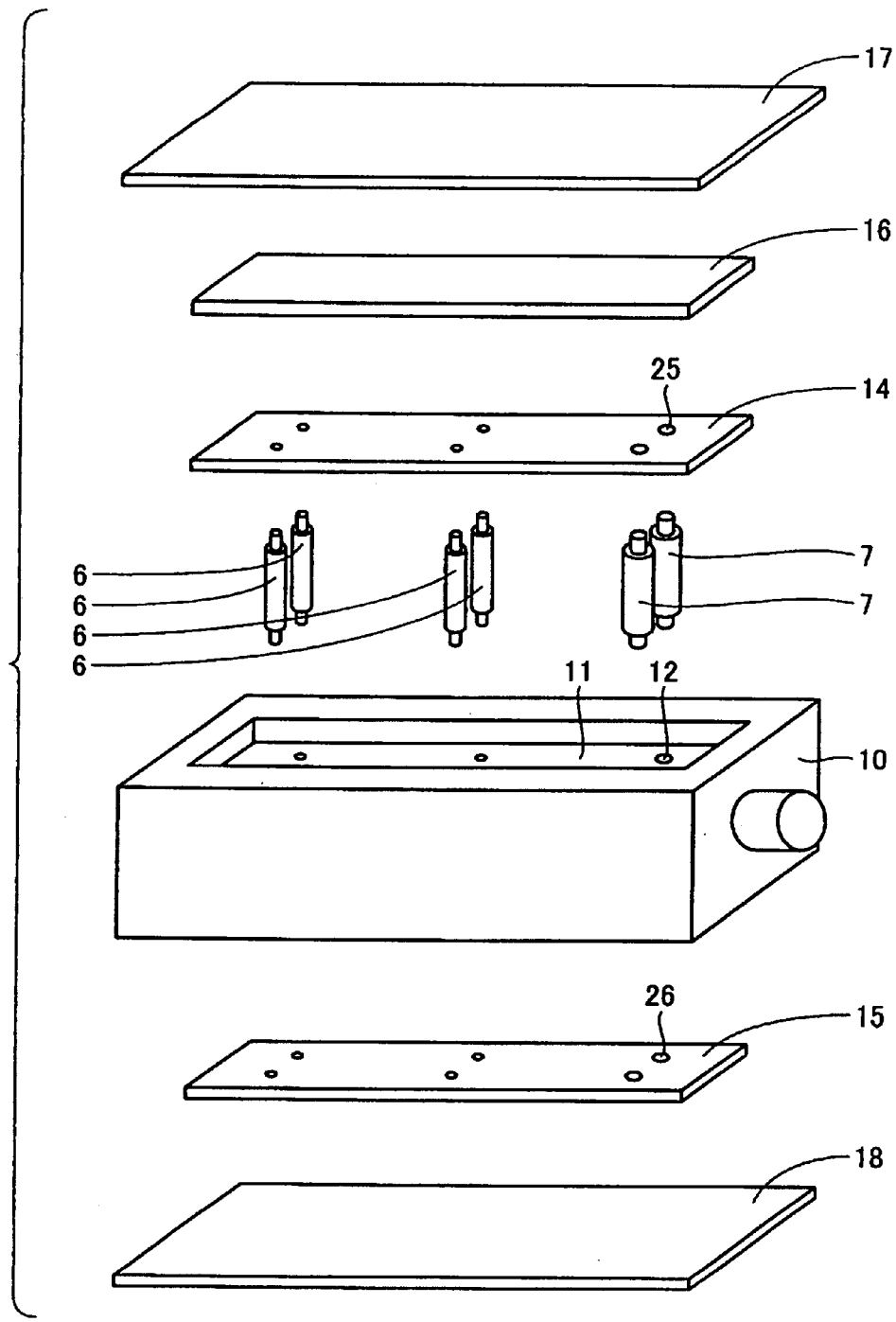
FIG. 4 is a schematic side view illustrating the wiring connection structure of a conventional transmitter.
Figure 5:
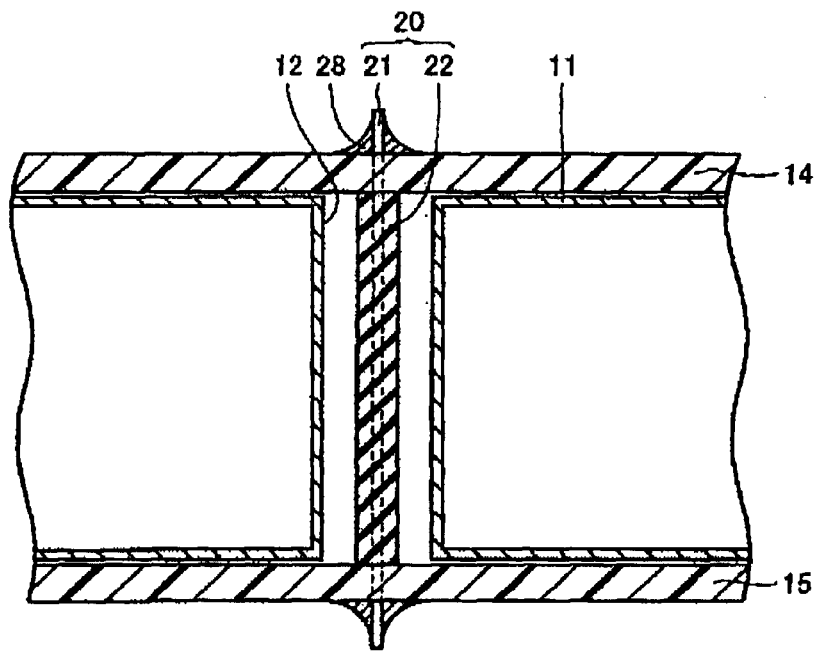
FIG. 5 is an enlarged cross section of a soldered portion, illustrating the wiring connection structure of the conventional transmitter.
Figure 6:
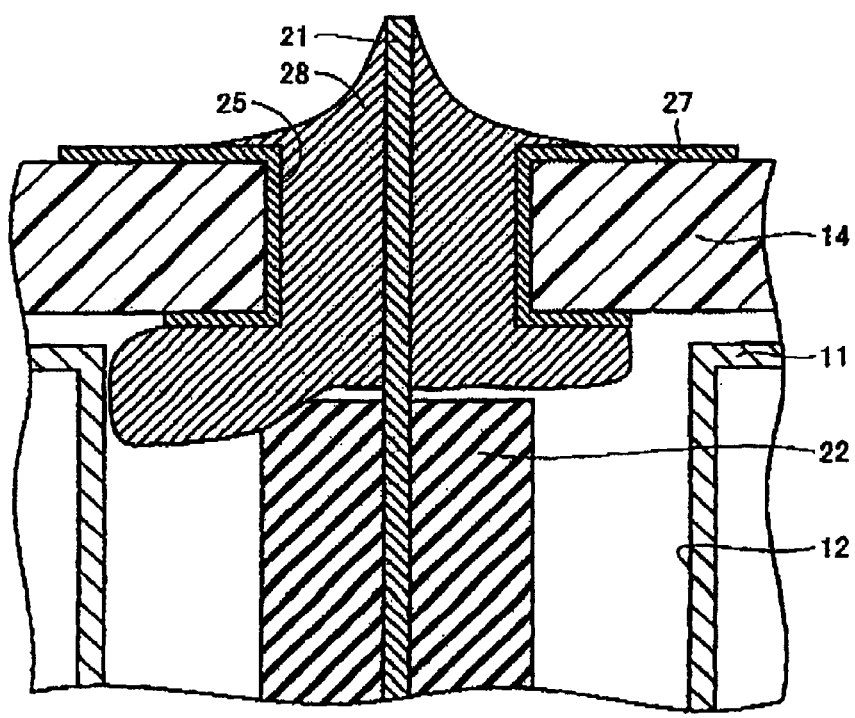
FIG. 6 is an enlarged cross section of the soldered portion, illustrating a problem experienced in the wiring connection structure of the conventional transmitter.

Next, referring to FIG. 2, the connecting portion between the board-to-board connecting wire and the RF board will be described. Connector 23 attached to board-to-board connecting wire 20 is fitted in recessed portion 13 provided around through hole 12 of shield plate 11 as described above, and RF board 14 is brought into contact from above with the shield plate 11 of chassis 10. At a prescribed position of RF board 14, a through hole 25 is formed, to which a tip end of board-to-board connecting wire 20 is inserted, and around through hole 25, a through hole land 27, which is an electrode consisting of a conductive material, is formed. Through hole land 27 and a tip end of board-to-board connecting wire 20 are connected with each other by solder 28 as a brazing material. The connecting portion between board-to-board connecting wire 20 and IF board 15 has the same structure.

(Connecting Procedure)

Next, the connecting procedure in the wiring connection structure will be described. First, one connector is inserted to and fixed on one end of the board-to-board connecting wire. Thereafter, the tip end of the board-to-board connecting wire, to which the connector is not attached, is inserted to the through hole provided in the shield plate of the chassis, such that the connector attached to the board-to-board connecting wire is fitted and fixed in one recessed portion of the chassis.

Further, the other connector is attached to the tip end of the board-to-board connecting wire, to which the connector has not yet been attached, and the connector is fitted in the other recessed portion of the chassis. At this time, the connector is fitted firmly in the recessed portion of the chassis so that a board-to-board connecting wire in the through hole will not be in contact with the inner wall surface of the through hole.

Thereafter, the circuit boards are both arranged to be in contact with the shield plate of the chassis such that the tip ends of the board-to-board connecting wire are inserted to the through holes of the two circuit boards, and soldering is performed between the through hole land and each tip end of the board-to-board connecting wire. Through this work procedure, the two circuit boards are surely connected electrically, by the board-to-board connecting wire.

(Function·Effect)

By the above described arrangement, positioning between the tip end of the board-to-board connecting wire and a through hole end of the circuit board is facilitated, and connecting work is facilitated, as the board-to-board connecting wire is surely fixed on the shield plate of the chassis by means of the connector. Further, as the positional accuracy of these can be controlled highly precisely at the time of connection, the size of the through hole can be reduced as compared with the prior art, and the amount of solder used for connection can be reduced as compared with the prior art. As a result, dripping off of the solder can be prevented and possibility of defective connection can be reduced. Thus, failure caused by short-circuit or impedance change can be prevented.

Further, as recessed portions are provided in the shield plate of the chassis for fitting and accommodating the connectors, fixing of the connectors with the chassis is ensured, and increase in size of the transmitter that would otherwise be caused by the addition of connector can be prevented. Further, the connector ensures distance between the board-to-board connecting wire and an inner wall surface of the through hole in the chassis. Therefore, it becomes possible to use a wire consisting of a bare core line only without any cover, as the board-to-board connecting wire.

Though the wiring connection structure of the present invention applied to a transmitter has been described as an example in the foregoing, the embodiment of the present invention is not limited thereto. The present invention is applicable as a wiring connection structure of any device that includes a plurality of circuit boards with a conductive member interposed between the circuit boards, for establishing electrical connection between the circuit boards.

Further, though the board-to-board connecting wire and the electrode of the circuit board are connected by solder in the embodiment above, the manner of connection is not specifically limited, and other method of connection such as welding or pressure contact may be used. In such a case, the connecting work can be facilitated, as the board-to-board connecting wire is fixed on a conductive member.

Though the shape of the connector is not specifically described in the embodiment above, the outer shape in the direction parallel to the circuit board may be any shape such as circular, elliptical, polygonal or star-shape. It is needless to say that the shape of the recessed portions formed in the conductive member must have the conforming shape. Further, the board-to-board connecting wire used in the wiring connection structure of the above described embodiment may be any wire including a vinyl covered cable, a coaxial cable, and a wire consisting only of the bare core line.

The transmitter described in the embodiment above is mainly installed outdoors. Therefore, the boards or the wire may expand/shrink slightly because of difference in temperature. Therefore, in order to ensure high reliability at the portion of the above described wiring connection structure, some measure to maintain high wiring strength is necessary. In order to realize high wiring strength, it may be possible to bundle a plurality of power supply lines into one power supply line, to maintain high strength. In that case, wires having core lines each covered by insulating member are used as the power supply lines, which are fixed to the conductive member using the above described connector, whereby the effects of the present invention and higher strength of the wires can simultaneously be realized. Here, as the lines are bundled to one, the wiring connection work can be facilitated and the number of connectors can be reduced, whereby manufacturing cost can also be reduced. Even when there is only one power supply line, the wire strength may be improved by bundling a plurality of lines and keeping lines other than the power supply line electrically isolated.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A wiring connection structure, comprising:

a first circuit board provided with a first electronic circuit, a second circuit board provided with a second electronic circuit;

a conductive member arranged between said first circuit board and said second circuit board;

a board-to-board connecting wire inserted in a through hole spaced by a gap apart from an inner wall surface of said through hole provided in said conductive member, for electrically connecting an electrode provided on said first circuit board with an electrode provided on said second circuit board; and connectors attached near opposite ends of said board-to-board connecting wire and sandwiching said conductive member to fix said board-to-board connecting wire on said conductive member.

2. The wiring connection structure according to claim 1, wherein each of said first and second circuit boards has a through hole to which a tip end of said board-to-board wiring is inserted, said electrode is formed at a peripheral edge of said through hole, provided in each of said first and second circuit boards and said board-to-board connecting wire and said electrode are connected to each other by a brazing material.

3. The wiring connection structure according to claim 1, wherein said conductive member is provided with a first recessed portion on a surface facing said first circuit board, for connecting the connector attached near one end of said board-to-board connecting wire, and a second recessed portion on a surface facing said second circuit board, for connecting the connector attached near the other end of said board-to-board connecting wire, and said connectors are fitted and fixed in these recessed portions.

4. The wiring connection structure according to claim 1, wherein said connector is formed of a resin material.

5. A transmitter, comprising:

a plurality of circuit boards each including a circuit for processing electric signals of a high frequency or an intermediate frequency or both;

a conductive member arranged between said plurality of circuit boards for shielding an electromagnetic wave generated from said circuit;

a board-to-board connecting wire inserted in a through hole spaced by a gap apart from an inner wall surface of said through hole provided in said conductive member, for electrically connecting electrodes provided respectively on said plurality of circuit boards with each other; and connectors attached near opposite ends of said board-to-board connecting wire and sandwiching said conductive member to fix said board-to-board connecting wire on said conductive member.

6. The transmitter according to claim 5, wherein each of said plurality of circuit boards has a through hole to which a tip end of said board-to-board connecting wire is inserted, said electrode is formed at a peripheral edge of said through hole provided in each of said plurality of circuit boards, and said board-to-board connecting wire and said electrode are connected with each other by a brazing material.

7. The transmitter according to claim 5, wherein said conductive member is provided with recessed portions on surfaces facing said circuit board, for accommodating said connectors, and said connectors are fitted and fixed in these recessed portions.

8. The transmitter according to claim 5, wherein said connector is formed of a resin material.

* * * * *